(12) United States Patent  
Capretta

(10) Patent No.: US 7,733,990 B2  
(45) Date of Patent: Jun. 8, 2010

(54) RECEIVER WITH IMPROVED SAMPLE GRANULARITY

(75) Inventor: Pietro Capretta, Brussels (BE)

(73) Assignee: STMicroelectronics Belgium NV, Zaventem (BE)

( * ) Notice: Subject to any disclaimer, the term of this patent is extended or adjusted under 35 U.S.C. 154(b) by 835 days.

(21) Appl. No.: 11/503,412

(22) Filed: Aug. 11, 2006

(65) Prior Publication Data

US 2007/0037510 A1 Feb. 15, 2007

(30) Foreign Application Priority Data

Aug. 12, 2005 (EP) ................... 05447183

(51) Int. Cl.  
H03D 1/00 (2006.01)

(52) U.S. Cl. ................ 375/340; 375/346; 375/230; 370/342

(58) Field of Classification Search ........... 375/346, 375/340, 230; 341/61, 50; 370/342  
See application file for complete search history.

(56) References Cited

U.S. PATENT DOCUMENTS

| | | | |
|---|---|---|---|
| 5,513,209 A | 4/1996 | Holm | |
| 5,579,345 A * | 11/1996 | Kroeger et al. | 375/344 |
| 5,907,295 A * | 5/1999 | Lin | 341/61 |
| 5,946,359 A | 8/1999 | Tajiri et al. | |
| 6,470,056 B1 | 10/2002 | Kurihara et al. | |
| 7,248,837 B2 * | 7/2007 | Woo | 455/69 |
| 2003/0142763 A1 * | 7/2003 | Kunleda et al. | 375/340 |
| 2004/0146119 A1 * | 7/2004 | Weiner et al. | 375/317 |
| 2004/0229650 A1 * | 11/2004 | Fitton et al. | 455/561 |

FOREIGN PATENT DOCUMENTS

| | | |
|---|---|---|
| EP | 0 872 985 A2 | 10/1998 |
| EP | 0 892 528 A2 | 1/1999 |

OTHER PUBLICATIONS

European Search Report from European Patent Application 05447183, filed Aug. 12, 2005.  
European Search Report from European Patent Application 05447185, filed Aug. 12, 2005.  
European Search Report from European Patent Application 05447182, filed Aug. 12, 2005.  
European Search Report from European Patent Application 05447184, filed Aug. 12, 2005.  
Rice, M. et al. "Polyphase filterbanks for symbol timing synchronization in sampled data receivers" Military Communications Conference. MILCOM 2002. Proceedings. Anaheim, CA, Oct. 7-10, 2002, IEEE Military Communications Conference, New York, NY: IEEE, US, vol. vol. 1 of 2, Oct. 7, 2002, pp. 982-986, XP010631909 ISBN: 0-7803-7625-0.

(Continued)

*Primary Examiner*—Chieh M Fan  
*Assistant Examiner*—Eva Y Puente  
(74) *Attorney, Agent, or Firm*—Lisa K. Jorgenson; James H. Morris; Wolf, Greenfield & Sacks, P.C.

(57) ABSTRACT

A receive path in a receiver including circuitry for deriving a first stream of first digitized samples from a received analog signal at a first sampling rate, and at least one interpolating filter in parallel with the first stream of first digitized samples for generating at least a second stream of digitized samples at the first sampling rate but offset with respect to the first stream by a fraction of a sample time period.

20 Claims, 3 Drawing Sheets

OTHER PUBLICATIONS

Min J. et al. "Synchronization techniques for a frequency-hopped wireless transceiver" Vehicular Technology for the Human Race., IEEE 46$^{TH}$ Atlanta, GA, USA Apr. 28-May 1, 1996, New York, NY, USA, IEEE, US vol. 1, Apr. 28, 1996, pp. 183-187, XP010162373 ISBN: 0-7803-3157-5.

Henker M., et al. "Time-variant CIC-filters for sample rate conversion with arbitrary rational factors" Electronics, Circuits and Systems, 1999. Proceedings of ICECS '99. The 6$^{th}$ IEEE International Conference on PAFOS, CYPRUS, Sept. 5-8, 1999, Picsataway, NJ, USA, IEEE, US, vol. 1, Sep. 5, 1999, pp. 67-70, XP010361448 ISBN: 0-7803-5682-9.

Gardner F. M. "Interpolation in Digital Modems. \Part I: Fundamentals" IEEE Transactions on Communications, IEEE Service Center, Piscataway, NJ, US, vol. 41, No. 3, Mar. 1, 1993, pp. 501-507, XP000372693, ISSN: 0090-6778.

* cited by examiner

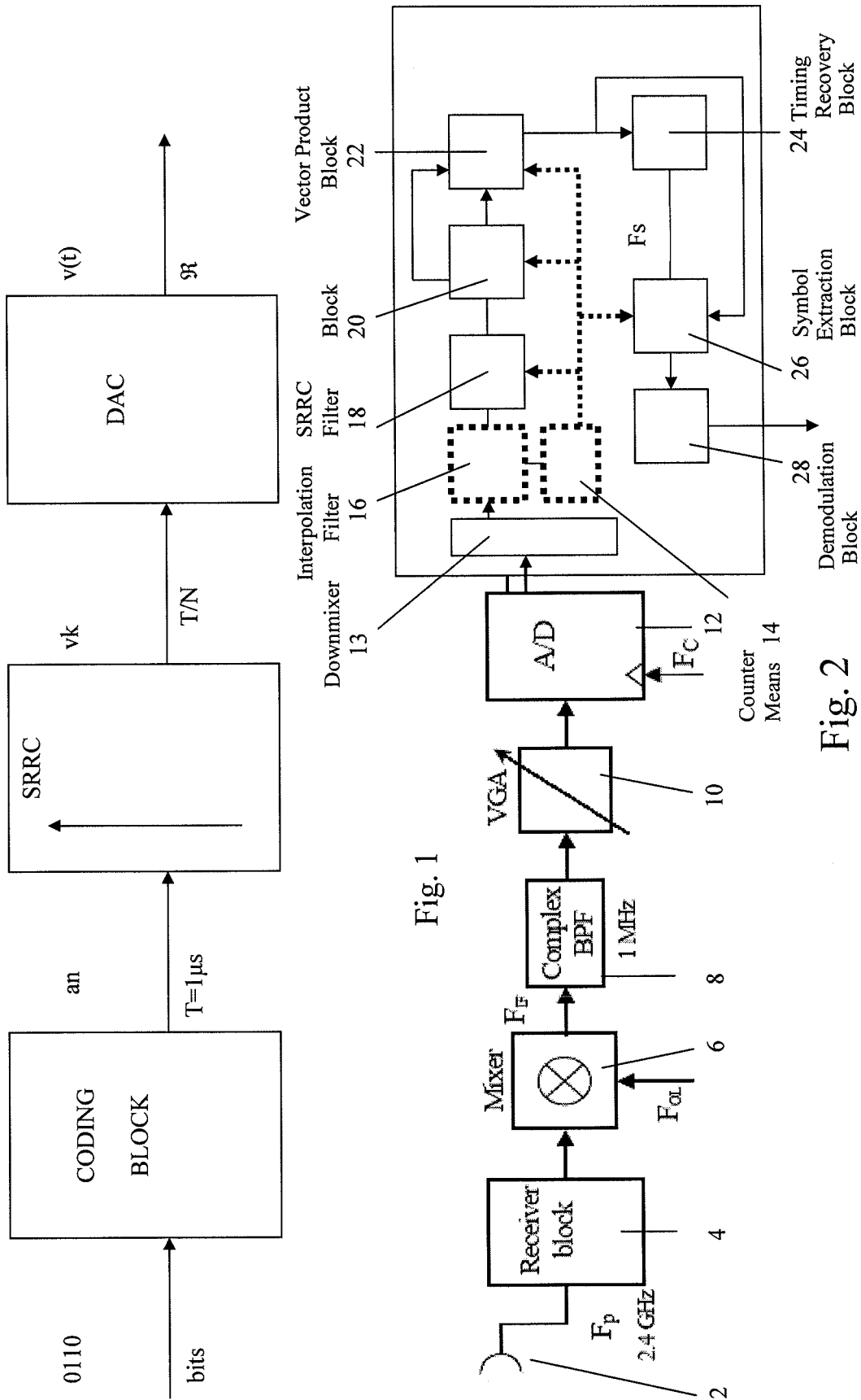

RECEIVER WITH IMPROVED SAMPLE GRANULARITY

BACKGROUND OF THE INVENTION

1. Field of the Invention

The present invention relates to telecommunication systems especially wireless systems, wireless transmitters and wireless receivers, especially those using the Bluetooth standard. The present invention also relates to semiconductor integrated circuits that implement a wireless receiver and/or a wireless transmitter especially those using the Bluetooth standard, as well as software for implementing the transmitter and/or receiver.

2. Technical Background

Version 2.0+EDR of the Bluetooth standards introduces an Enhanced Data Rate (EDR) operation. The EDR standard is an improvement over the Basic Rate standard. New modulation schemes: $\pi/4$-DQPSK and 8DPSK, are proposed as well as the conventional GFSK. The bandwidth of the channel is 1 MHz.

A Bluetooth transmitter is shown schematically in FIG. 1. The bits for transmission arrive at 1 Mbps, 2 Mbps or 3 Mbps and are coded in symbols "an" at 1 Msymbol per second. So the symbol time period "T" is 1 ps. The symbols are shaped with the SRRC filter and the modulated signal with a digital level can be produced using any whole multiple of 1 MHz. For example, 13 MHz can be used as this is an available clock in a Bluetooth system. Finally a Digital to analog converter (DAC) is used to produce the analog modulated signal to be sent to the analog part of the transmitter.

A Bluetooth receiver has an analog front end and a digital part. At the Analog to Digital converter (ADC) in a Bluetooth receiver there are two simple possibilities for the sampling frequency: 13 MHz or 6.5 MHz. When operating at a sampling frequency of 6.5 MHz, theoretically the SRRC-receive filters (SRRC-Rx) could be matched to the SRRC-transmit filter (SRRC-Tx). However, the sampling frequency for the receiver has to be an integer multiple of the output frequency value of 1 MHz. One way is sampling at 13 MHz or even 26 MHz. This increases the complexity of the demodulator block, increases power consumption and cost. Another way of doing this is to provide an additional oscillator to generate a whole integer multiple frequency of 1 MHz lower than 13 MHz, e.g. 8 MHz, to clock the ADC and the other components of the digital part. Although sampling frequencies at lower frequencies such as 8 MHz can reduce the cost and complexity of the digital part of the receiver chain, it also reduces the accuracy of sample extraction as the number of samples per symbol is low.

SUMMARY OF THE INVENTION

It is an object of the present invention to provide a receiver for a wireless telecommunications device which has a good accuracy of sample extraction. An advantage of the present invention is that wireless receiver such as a Bluetooth receiver can be implemented with low power consumption. A further advantage is that the receiver can be an Enhanced Data Rate receiver able to use a better modulation, e.g. an M-state phase modulation, especially an M-state differential phase modulation with M equal to or greater than 2.

In one aspect the present invention provides a receive path in a receiver comprising means for deriving a first stream of first digitized samples from a received analog signal at a first sampling rate, at least one interpolating filter in parallel with the first stream of first digitized samples for generating at least a second stream of digitized samples at the first sampling rate but offset with respect to the first stream by a fraction of a sample time period. This provides the advantage that a higher sample granularity can be obtained without increasing the sample rate. The at least one interpolating filter can be implemented using an FIR filter. This is a cost effective solution as a filter with 10 taps can be sufficient.

The first and the at least one second streams can be fed directly to a sample extraction block. By delaying the generation of the additional stream to just before the sample extraction, the rest of the digital receive path is kept simple. The sample extraction block is adapted to select a sample from either the first or the at least one second streams as a symbol thus providing the increased granularity, i.e. more samples closer together in order to select from.

The means for deriving a first stream of first digitized samples from a received analog signal at a first sampling rate may comprise: means for generating a third stream of digitized samples from the received analog signal at a second sampling rate and a further interpolating filter receiving the third stream from the means for generating the third stream, to generate the stream of first digitized samples which are estimates of samples obtainable by sampling the received analog signal at the first sample rate lower than the second sampling rate, the first digitized samples being output at the first sampling rate and including at least one unusable sample. The advantage of this arrangement is that separate oscillators at the first and second sampling rates are not required while still allowing the first sampling rate to be a whole multiple of the baseband signal rate, e.g. 1 MHz.

Preferably, the receive path includes a circuit for generating a signal for controlling components of the receive path downstream of the further interpolation filter to prevent processing of the unusable second digitized samples. This circuit can be constructed simply, e.g. as a counter. A counter is a simple circuit which is cost-effective and takes up little chip area.

An SRRC filter can be provided for receiving the first digitized samples, the SRRC filter being configured to process samples at the first sample rate. The use of an SRRC filter in the receive path matched to an SRRC filter in the transmitter provides advantages in eliminating ISI.

The second sampling rate can be a fractional multiple of a baseband signal rate, e.g. 6.5 MHz, whereas the first sampling rate can be a whole integer multiple of the baseband signal rate, e.g. 6 MHz. The receiver can be a Bluetooth receiver. 6 MHz is a whole multiple of 1 MHz, the symbol rate for Bluetooth and is close to 6.5 MHz which is a frequency easily available in Bluetooth receivers.

According to the invention the components in the digital part such as the interpolation filters and the SRRC filter are all clocked at the same frequency. This avoids additional oscillators.

The present invention also provides a method of operating a receiver comprising: deriving a first stream of first digitized samples from a received analog signal at a first sampling rate, interpolating in parallel with the first stream of first digitized samples for generating at least one second stream of digitized samples at the first sampling rate but offset with respect to the first stream by a fraction of a sample time period.

The method can also include selecting a sample from the first and the at least one second streams as a symbol.

The method may include a step of downconverting a received wireless signal into a lower frequency analog signal, the downconverting step being followed by a digitization step on said lower frequency analog signal such as to obtain the in-phase component and the orthogonal phase component of the digital baseband signal.

Alternatively, digitization can include an analog/digital conversion followed by a digital downconversion such as to obtain said in-phase component and said orthogonal phase component. The digitization step may include oversampling.

An optional vector product step may also be applied.

The present invention includes software products for implementing any of the methods or devices according to the present invention in software for execution on a processing engine such as a microprocessor or an FPGA. The software may be supplied stored on a suitable machine readable signal medium such as an optical disk, e.g. CD-ROM or DVD-ROM, or disk or diskette, solid state memory, magnetic tape.

BRIEF DESCRIPTION OF THE DRAWINGS

FIG. 1 is a schematic representation of a transmitter which may be used with a receiver according to the present invention.

FIG. 2 is a schematic representation of a receiver with which the present invention can be used.

DETAILED DESCRIPTION

The present invention will be described with reference to certain drawings and to certain embodiments but this description is by way of example only.

Figure 3:
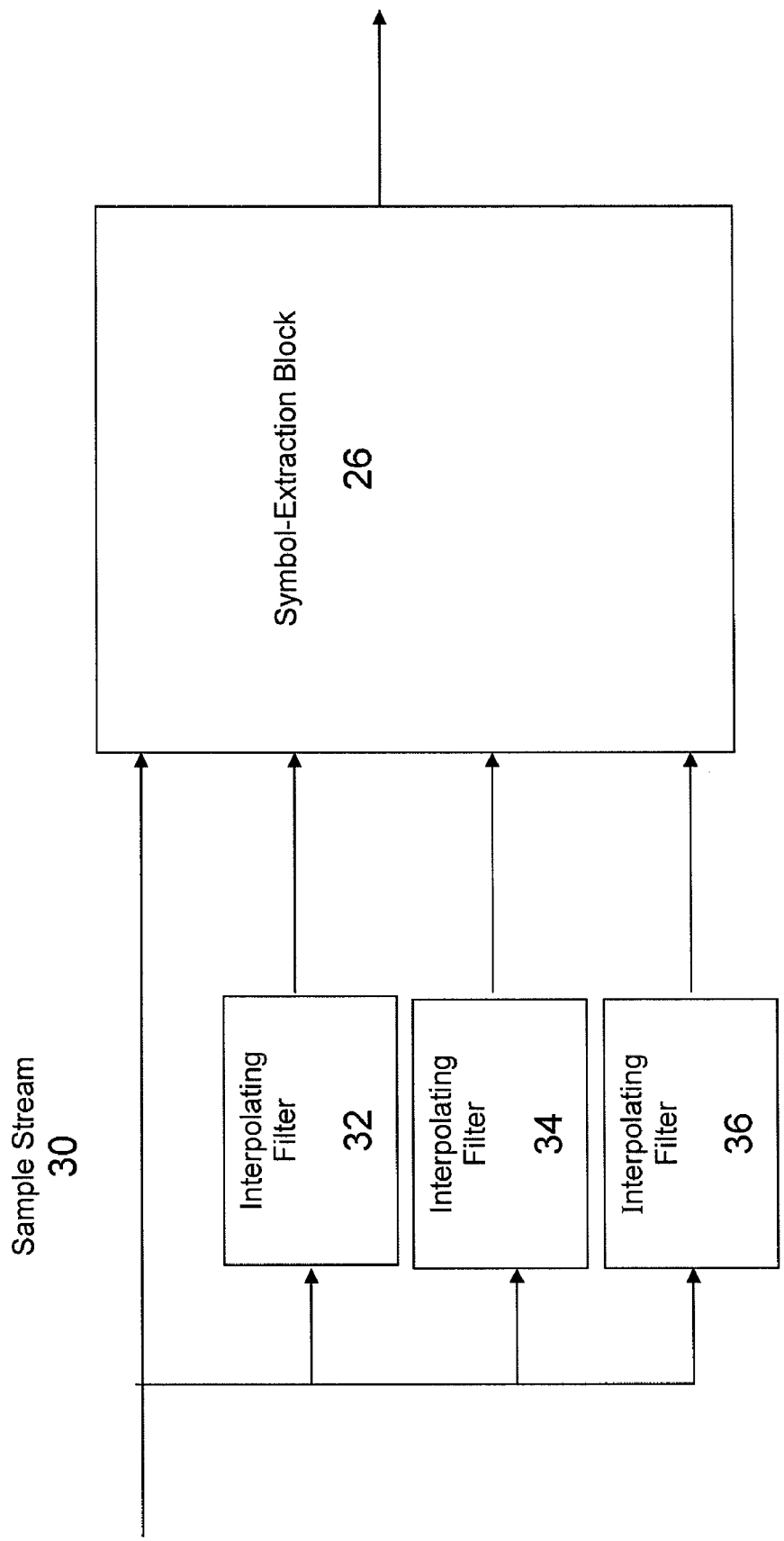
FIG. 3 is a detail of the receiver of FIG. 2 showing an embodiment of the present invention.
Figure 4A:
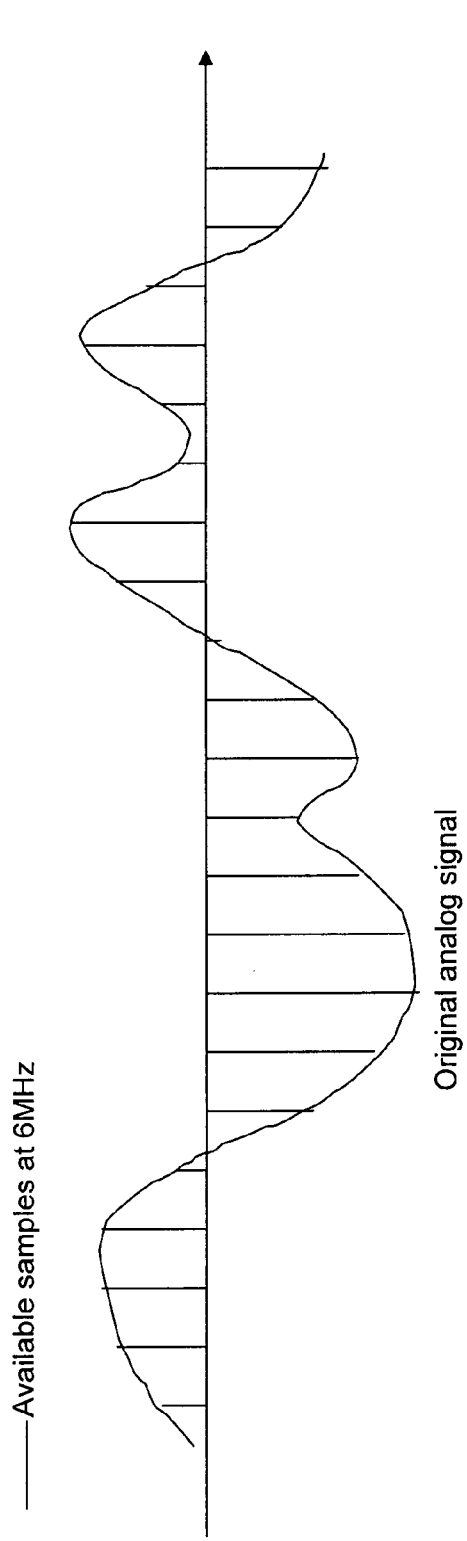
FIGS. 4a and b show a conventional sample stream in FIG. 4a and a sample stream according to the present invention.
Figure 4B:
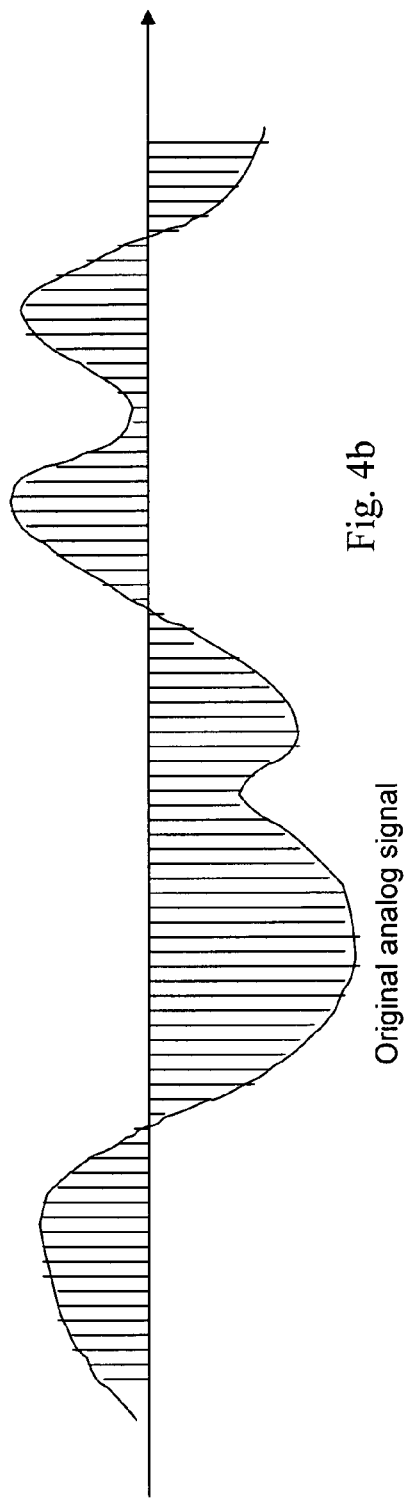

A basic receiver such as a Bluetooth receiver or transceiver will be described with reference to FIG. 2. When implemented in a transceiver a transmit path is also provided which, however, will not be described. Subsequently, FIG. 3 will be described that shows an embodiment of the present invention. FIG. 3 is a detailed view of part of a receiver path such as shown in FIG. 2.

The analog radio front end and the digital part separated by an analog to digital converter (ADC) as shown in FIG. 2 are examples only and are not limiting of the present invention. In the radio front-end the RF filters, oscillators, and image-reject mixers process input signals at high frequencies. To keep costs down, the input signal can be shifted to a lower intermediate frequency which allows on-chip construction of low power filters. The RF transmitted signal centered on 2.4 GHz is received at an antenna 2 and filtered by the Reception band-pass filter 4. An analog Down-Mixer 6 and a Complex band pass filter 8 can then be used to obtain the bandpass signal, which occupies a 1 MHz-band centered on the intermediate frequency. Although not shown, the local oscillator frequency ($F_{OL}$) value of the down-mixer can be modified by feedback control from the timing recovery block in the digital part (see later). A Voltage Gain Adaptation (VGA) block 10 can be used in order to adapt the signal amplitude to the input dynamic range of the other blocks in the device. In particular, it is useful to control the amplitude so as not to overrange the A/D converter (ADC) 12. The signal is sampled with a sampling frequency $F_c$ equal to a whole number multiple of 1 MHz, e.g. 8 MHz, and the signal is digitized using an A/D converter 12. The analog signal is oversampled as $F_c$ is higher than the baseband signal rate of 1 MHz. In an alternative the sampling frequency $F_C$ may be a fractional multiple of the baseband signal rate, e.g. 6.5 Mhz. Although the sampling frequency for both the DAC in the transmitter and the receive ADC 12 needs to be a whole multiple of 1 MHz if SRRC filters are to be used and the advantage of reduction of ISI obtained, it is not necessary that the integer value be the same for both transmit and receive paths. In an alternative, the sampling frequency $F_c$ may be a fractional multiple of the baseband signal rate, e.g. 6.5 MHz.

In the following some possible components downstream of the ADC 12 in FIG. 2 are described. These are not limiting for the invention. As an example of possible downstream blocks the digitized signal from the ADC 12 can be processed optionally through a downmixer 13 in which the signals from the ADC 12 are combined with signals from a low frequency, e.g. baseband frequency oscillator, e.g. a numerically controlled oscillator. The numerically controlled oscillator may receive a frequency offset signal from the digital elaboration part of the receiver (not shown) to compensate for carrier frequency offset, see for example U.S. Pat. No. 6,703,896. The signals may then be filtered e.g. an SRRC filter 18. An SRRC is a filter which approaches a Nyquist filter, i.e. one which has a perfect (vertical) cut-off. In fact an SRRC filter does not have a perfect cut-off but has a roll-off which means that the filtered output requires more bandwidth than a perfect Nyquist filter. The complex digitized input signal to be supplied to the SRRC is split into the two real components: the in-phase and the in-quadrature digitized signals. At this point, each component is filtered by the SRRC filter 18. A FIR filter structure can be chosen for the implementation of the SRRC 18. The FIR filter is provided with coefficients (taps) to thereby perform SRRC filtering for both the complex signal components. The shaped samples from the SRRC 18 are supplied to a Vector Product block 22. This block combines two digitized complex symbols, one being delayed with respect to the other. For example, one can be delayed by one sample period in block 20. Reference is made to U.S. Pat. No. 6,703,896 for further details which is incorporated herein by reference. The output of the vector product block 22 is used to obtain the symbol timing in block 24. A Symbol-Extraction block 26 selects one digitized symbol every symbol period in the position specified by the timing recovery block 24. Each demodulated symbol is chosen among the samples belonging to the digitized signal.

In an alternative embodiment of the present invention, a fractional frequency such as 6.5 MHz can be used as explained below to clock the ADC 12 and other components downstream of the ADC. For the transmit side a value of 13 MHz can be used to clock the DAC. However, on the receive side, it is preferred to use a low value such as 6.5 MHz as the sampling frequency for the ADC 12 and for components of the digital receive path downstream of the ADC 12. This reduces the cost of the ADC and downstream components in the receiver chain. If the received analog signals are digitized in the ADC 12 at a first sampling rate of 6.5 MHz to generate first digitized samples, this is a non-whole integer of 1 MHz. This problem can be solved in this alternative embodiment by inserting an interpolation filter 16 prior to the SRRC filter 18. Interpolation filters are well known to the skilled person and may be implemented in a variety of ways, e.g. FIR, polyphase filter. The additional optional components of this embodiment are shown as dashed lines in FIG. 2. The interpolation filter 16 runs at a fractional frequency of the baseband signal rate, e.g. 6.5 MHz and estimates from the first digitized samples obtained at the sample rate of 6.5 MHz received from the ADC 12, second samples which would have been obtained if the sampling frequency of the received analog signal would have been a whole integer multiple of the baseband signal rate (1 MHz for Bluetooth), e.g. 6 MHz. The interpolation filter 16 may be implemented in any suitable way, e.g. as a FIR filter.

The taps of the FIR filter are altered for each sample to interpolate the next sample to be used in the demodulation.

For example, the output of the filter 16 can be represented as the following sequence:

ABCDEFGHILMNXOPQRSTUVZABCXDEFG...

If a real 6 MHz sampling had been carried out the sequence would be:

ABCDEFGHILMNOPQRSTUVZABCDEFG...

The output of filter 16 is an estimation of the samples which would have been obtained from the received analog signal if it would have been sampled at 6 MHz with the addition of one unused sample every 13 samples which is indicated with X in the sequences above. In accordance with this embodiment, the 13 samples obtained from the ADC 12 are interpolated to 12 values which are an estimate of the samples which would have been obtained if the sampling of the received analog signal would have been performed at 6 MHz and with the addition of one sample—the $13^{th}$. This $13^{th}$ sample would not have been included in samples at 6 MHz and is not used in subsequent processes. In order to record the 13th sample, a counter means 14 is provided. This counter means 14 transmits a suitable signal at each $13^{th}$ symbol to downstream components in order to control the operation of these devices, e.g. deactivate these components or otherwise ensure that the $13^{th}$ bits are not used. The counter means can be implemented in any suitable way known for counters. Although in the above 6 MHz has been chosen, other integer values could be taken, e.g. 5 MHz however 6 MHz is preferred as it is closest to 6.5 MHz and the minimum number of samples are unused, i.e. 1.

The first downstream component affected by the use of filter 16 is the SRRC 18. A FIR filter structure can be chosen for the implementation of the SRRC 18. The FIR filter is provided with coefficients (taps) to thereby perform SRRC filtering for both the complex signal components. It operates at a clock frequency of 6.5 MHz but has coefficients (taps) for processing samples at 6 MHz, i.e. the taps of the SRRC filter are configured to process symbols sampled at 6 MHz while the device is being operated at 6.5 MHz. The SRRC receives from filter 16 samples which are the same as those which would have been obtained from the ADC 12 at a sampling frequency of 6 MHz with the addition of an unused (unreliable)$13^{th}$ sample. This means that every $13^{th}$ sample received by the SRRC 18 must be ignored. This is achieved by the signal for the $13^{th}$ sample from the counting means 14 being received at the SRRC filter 18 and that the SRRC 18 is adapted so that on receipt of this blocking signal it does not process this $13^{th}$ sample. The $13^{th}$ sample will have some indeterminate value and is not reliable. Hence it cannot be used in other downstream modules. The SRRC filter 18, the ADC 12, and the interpolating filter 16 can all be clocked at the same frequency, e.g. the fractional baseband frequency 6.5 Mhz, or a multiple thereof.

In the following some further possible downstream components are described. These are not limiting for the invention. As an example of possible downstream blocks the signal can be processed through a Vector Product block 22. This block combines two digitized complex symbols, one being delayed by one sample period as described above. The output of the vector product block 22 is used to obtain the symbol timing in block 24. A Symbol-Extraction block 26 selects one digitized symbol every T period in the position specified by the timing recovery block 24. This symbol is chosen among the 12 samples belonging to the digitized signal whereby the $13^{th}$ sample is always ignored.

Finally, demodulation, e.g. using a GFSK, π/4-DQPSK or 8-DPSK demodulator, is carried out in demodulation block 28 for any of the schemes described above. For π/4-DQPSK or 8-DPSK modulation, this block 28 evaluates the phase difference of the selected sample. It recognizes in which region of the constellation points the received signal samples are located. For π/4-DQPSK a check is made in which phase quadrant the sample is located. For the 8-DPSK eight constellation regions are checked.

The present invention addresses the fact that the number of samples arriving at the Symbol-Extraction block 26 is low, e.g. at a rate of 6 or 8 MHz. As shown in FIG. 3 this stream of samples is given the reference number 30. In parallel with the stream 30 at least one additional interpolating filter 32, 34, 36 is provided. Interpolating filters are well known to the skilled person. They may be implemented in a variety of ways, e.g. FIR, polyphase filter, etc. The one or each interpolating filter 32, 34, 36 provides at its output samples at the same rate as the stream 30, e.g. 6 or 8 MHz but each set of samples is offset with respect to the sample stream 30. For example, if the sample stream 30 is running at 6 Mhz and there are three filters in parallel, then the sample stream output from the first filter 32 is offset with respect to the sample stream 30 by one quarter of a sample period. The output of the second interpolating 34 is offset one quarter of a sample period with respect to the output from filter 32 and the output of the third interpolating filter 36 is offset by one quarter of a sample period compared to the output of filter 34. For example, each of these filters 32, 34, 36 can be a FIR filter needing only a 10 taps. The input to the Symbol-Extraction block 26 is therefore equivalent to 4×6 MHz or a sample stream at 24 MHz. This provides an additional accuracy in selecting the sample for each symbol while requiring only extra filters of low complexity and small size. Hence the electronic circuitry making up the digital part of the receiver is run at a low frequency such as 6.5 MHz or 8 MHz which means the components in the digital receiving path are small size, e.g. the filters but a better sample granularity is rebuild before the symbol extracting block 26. For example, it is possible to achieve a receive sample granularity of 24 MHz in a system that requires a maximum clock frequency of 13 MHz, e.g. for the transmitter. This means that the power consumption can be kept low. Although the additional filters 32, 34, 36 are shown located parallel to the sample stream 30 just before the symbol extracting block 26, these filters can be placed at any position in the digital receive path after the ADC 12 and before the sample extracting block 26. the closer the filters are placed to the sample extracting block 26, the more of the digital receive path which is operating at a low frequency, i.e. the lower power required and the simpler the construction. The present invention can achieve a good BER performance for 3 Mbps EDR.

The receiver according to the present invention may be implemented as a program running on a personal computer. The above receiver can be implemented as an integrated circuit or by other means, e.g. on a printed circuit board. The receiver according to the present invention may be implemented on an Integrated Circuit comprising an embedded processor. The processor may be a microprocessor or a programmable gate array such as a field programmable gate array or any other suitable processing means. In particular software according to the present invention may include code segments which when implemented on a processing engine execute at least one interpolating filter in parallel with a first stream of first digitized samples at a first sampling rate for generating at least a second stream of digitized samples at the first sampling rate but offset with respect to the first stream derived from an analog signal at the first sampling rate by a fraction of a sample time period. The code may provide the at least one interpolating filter as a FIR filter. The code may also provide a sample extraction block and also the feeding of the first and the at least one second streams to the sample extraction block. The code may also be adapted to select a sample from either the first or the at least one second streams as a symbol. The code may also be adapted such that the deriving of the first stream of first digitized samples from a received analog signal at the first sampling rate comprises generating a third stream of digitized samples from the received analog signal at a second sampling rate and interpolating the third stream to generate the stream of first digitized samples which are estimates of samples obtainable by sampling the received analog signal at the first sample rate lower than the second sampling rate, the first digitized samples being output at the first sampling rate and including at least one unusable sample. The code may also implement a circuit for generating a signal for controlling other components than the further interpolation filter to prevent processing of the unusable second digitized samples. The code may also implement an SRRC filter for receiving the second digitized samples, the SRRC filter being configured to process samples at the first sample rate.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A receive path in a receiver, comprising:
   means for deriving a first stream of first digitized samples from a received analog signal at a first sampling rate,
   at least one interpolating filter in parallel with the first stream of first digitized samples for generating at least a second stream of digitized samples at the first sampling rate but offset with respect to the first stream by a fraction of a sample time period,
   wherein the means for deriving the first stream of first digitized samples from the received analog signal at the first sampling rate comprises:
      means for generating a third stream of digitized samples from the received analog signal at a second sampling rate; and
      a further interpolating filter receiving the third stream from the means for generating the third stream, to generate the first stream of first digitized samples which are estimates of samples obtainable by sampling the received analog signal at the first sample rate lower than the second sampling rate, the first digitized samples being output at the first sampling rate and including at least one unusable sample.

2. The receive path according to claim 1, wherein the at least one interpolating filter is a FIR filter.

3. The receive path according to claim 1, wherein the first and the at least one second streams are fed to a sample extraction block.

4. The receive path according to claim 3, wherein the sample extraction block is adapted to select a sample from either the first or the at least one second streams as a symbol.

5. The receive path according to claim 1, further comprising:
   a circuit for generating a signal for controlling components of the receive path downstream of the further interpolation filter to prevent processing of the unusable second digitized samples.

6. The receive path according to claim 1, further comprising a square root raised cosine (SRRC) filter for receiving the first digitized samples, the SRRC filter being configured to process samples at the first sample rate.

7. The receive path according to claim 5, wherein the circuit for generating a signal is a counter.

8. The receive path according to claim 1, wherein the receiver is a Bluetooth receiver.

9. The receive path according to claim 1, wherein the second sampling rate is a fractional multiple of the baseband signal rate.

10. The receive path according to claim 1, wherein the first sampling rate is a whole integer multiple of the baseband signal rate.

11. A method of operating a receiver, comprising:
    deriving a first stream of first digitized samples from a received analog signal at a first sampling rate,
    interpolating in parallel with the first stream of first digitized samples to thereby generate at least one second stream of digitized samples at the first sampling rate but offset with respect to the first stream by a fraction of a sample time period,
    wherein deriving the first stream of first digitized samples from the received analog signal at the first sampling rate comprises:
       generating a third stream of digitized samples from the received analog signal at a second sampling rate; and
       interpolating the third stream of digitized samples, to generate the first stream of first digitized samples which are estimates of samples obtainable by sampling the received analog signal at the first sampling rate lower than the second sampling rate, the first digitized samples being output at the first sampling rate and including at least one unusable sample.

12. The method according to claim 11, further comprising selecting a sample from the first and the at least one second streams as a symbol.

13. A receive path in a receiver, comprising:
    an analog to digital converter for deriving a first stream of first digitized samples from a received analog signal at a first sampling rate;
    a first interpolating filter receiving the first stream of first digitized samples from the analog to digital converter, to generate a second stream of second digitized samples which are estimates of samples obtainable by sampling the received analog signal at a second sampling rate lower than the first sampling rate, the second digitized samples being output at the second sampling rate and including at least one unusable sample; and
    at least one second interpolating filter in parallel with the second stream of second digitized samples for generating at least one third stream of digitized samples at the second sampling rate but offset with respect to the second stream by a fraction of a sample time period.

14. The receive path according to claim 13, wherein the second and the at least one third streams are fed to a sample extraction block, the sample extraction block being adapted to select a sample from either the second or the at least one third streams.

15. The receive path according to claim 13, further comprising:
    a circuit for generating a signal for controlling components of the receive path downstream of the first interpolation filter to prevent processing of the unusable second digitized samples.

16. The receive path according to claim 15, wherein the circuit for generating a signal is a counter.

17. The receive path according to claim 13, wherein the receiver is a Bluetooth receiver.

18. The receive path according to claim 13, wherein the first sampling rate is a fractional multiple of the baseband signal rate.

19. The receive path according to claim 13, wherein the second sampling rate is a whole integer multiple of the baseband signal rate.

20. The receive path according to claim 13, further comprising a square root raised cosine (SRRC) filter for receiving the first digitized samples, the SRRC filter being configured to process samples at the first sample rate.

* * * * *